United States Patent
Drechsler et al.

(10) Patent No.: US 11,520,228 B2
(45) Date of Patent: Dec. 6, 2022

(54) MASS FABRICATION-COMPATIBLE PROCESSING OF SEMICONDUCTOR METASURFACES

(71) Applicant: International Business Machines Corporation, Armonk, NY (US)

(72) Inventors: Ute Drechsler, Rueschlikon (CH); Emanuel Marc Löertscher, Bonstetten (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/011,235

(22) Filed: Sep. 3, 2020

(65) Prior Publication Data
US 2022/0066314 A1 Mar. 3, 2022

(51) Int. Cl.
*G03F 7/00* (2006.01)
*G02B 1/00* (2006.01)
*H01J 37/32* (2006.01)

(52) U.S. Cl.
CPC ........... *G03F 7/0002* (2013.01); *G02B 1/002* (2013.01); *H01J 37/321* (2013.01); *H01J 2237/334* (2013.01)

(58) Field of Classification Search
CPC ...... G03F 7/0002; G02B 1/002; H01J 37/321; H01J 2237/334; H01L 21/31116
USPC .................................. 216/2, 41, 42, 47, 48
See application file for complete search history.

(56) References Cited

U.S. PATENT DOCUMENTS

| 10,811,252 | B2* | 10/2020 | Yamamoto | ........ H01L 21/31058 |
| 2007/0269721 | A1* | 11/2007 | Kim | .................. H01J 37/32082 430/5 |
| 2014/0335215 | A1* | 11/2014 | Hayashi | ................ B29C 59/002 425/385 |
| 2015/0111005 | A1* | 4/2015 | Hosomi | ................ B29C 59/022 428/174 |

(Continued)

FOREIGN PATENT DOCUMENTS

| WO | 2017201602 A1 | 11/2017 |
| WO | 2019046827 A1 | 3/2019 |

OTHER PUBLICATIONS

Genevet et al., "Recent advances in planar optics: from plasmonic to dielectric metasurfaces", vol. 4, No. 1 / Jan. 2017 / Optica, published Jan. 19, 2017, 14 pages.

(Continued)

*Primary Examiner* — Lan Vinh
(74) *Attorney, Agent, or Firm* — Stephen R. Yoder

(57) ABSTRACT

A method of processing a layer structure with a semiconductor layer to form metasurface structures is disclosed. The method relies on a layer structure that includes a substrate, a layer stack, and resist structures. The latter are made of a resist material that includes a semiconductor element. The layer stack is arranged on top of the substrate. The resist structures form a pattern on the layer stack. The layer stack includes: a semiconductor layer (arranged on top of the substrate); a protective layer (arranged on top of the semiconductor layer); and a transfer layer (arranged on top of the protective layer). The layer structure is obtained by forming the layer stack on top of the substrate, wherein the protective layer is deposited using an atomic-layer deposition process.

20 Claims, 5 Drawing Sheets

(56) References Cited

U.S. PATENT DOCUMENTS

| | | | | |
|---|---|---|---|---|
| 2016/0077377 A1* | 3/2016 | Kim | ................ | G02B 5/3058 |
| | | | | 349/96 |
| 2017/0110548 A1* | 4/2017 | Kawaguchi | ......... | H01L 29/7786 |
| 2017/0219520 A1* | 8/2017 | Liu | ............. | H01L 27/085 |
| 2018/0175175 A1* | 6/2018 | Yeong | ............. | H01L 29/165 |
| 2018/0341090 A1 | 11/2018 | Devlin | | |
| 2019/0033683 A1 | 1/2019 | Ahmed | | |
| 2019/0318957 A1 | 10/2019 | Godet | | |

OTHER PUBLICATIONS

Rybin et al., "Supercavity Lasing", Research News & Views, Optical Physics, Nature I vol. 541I Jan. 12, 2017, ©2017 Macmillan Publisher Limited, 2 pages.

Tittl et al., "Imaging-based molecular barcoding with pixelated dielectric metasurfaces", Research, Applied Optics, Science 360 Jun. 8, 2018, 6 pages.

Wang et al. "Metasurfaces for Spatial Light Manipulation", Chapter 3, INTECH, 27 pages, <http://dx.doi.org/10.5772/66319>.

Wikipedia, "Nanoimprint lithography", This page was last edited on Apr. 13, 2020, 6 pages.

* cited by examiner

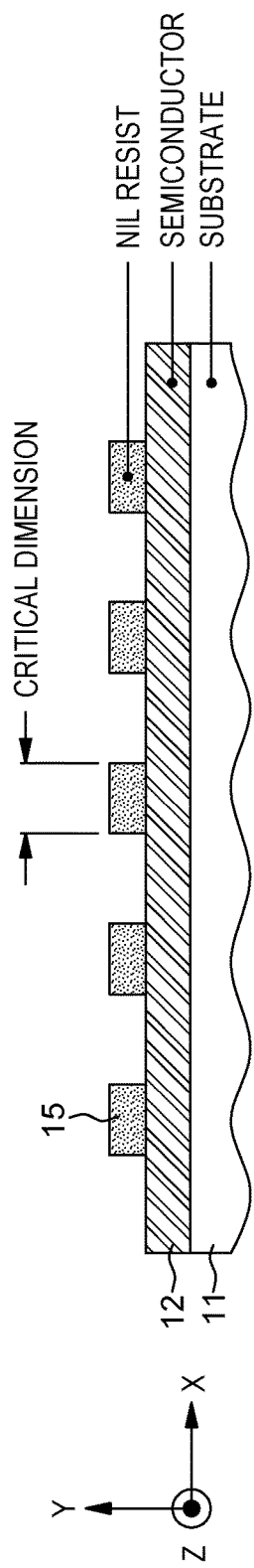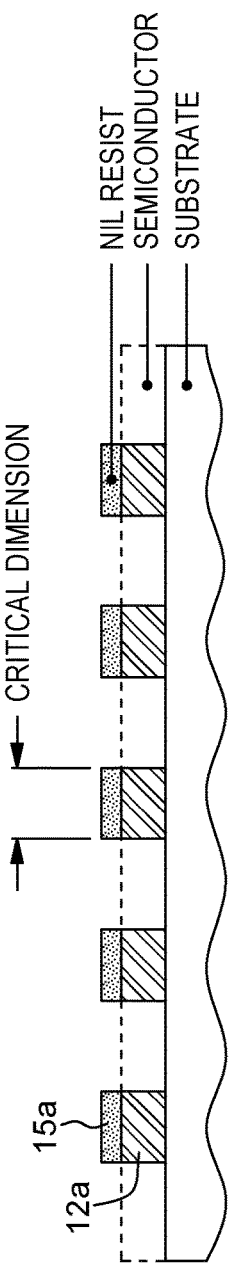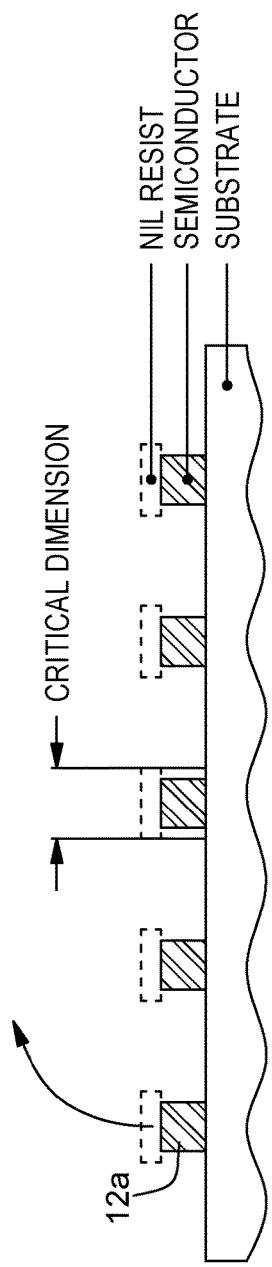

MASS FABRICATION-COMPATIBLE PROCESSING OF SEMICONDUCTOR METASURFACES

BACKGROUND

The invention relates in general to semiconductors, and more specifically to techniques of processing layer structures to fabricate accurate and defect-free semiconductor metasurface structures.

Metal (plasmonic) and dielectric metasurfaces are a class of flat-optical elements, which allow light to be manipulated in a very efficient way below the diffraction limit. Applications include field-enhancement, polarization change, spatial light-bending, spectral filtering, narrow-band absorption, etc. Metasurfaces tailored to operate in the visible and near-infrared regime of the electromagnetic spectrum have nanometer-sized dimensions, typically ranging between a few 10s to 100s of nanometers or even smaller.

The operation of such structures mostly relies on resonance conditions with incident light of specific wavelength. For resonant and efficient operation, the geometrical dimensions must be very accurately matched, typically requiring control on the 1-nanometer level and ideally in all three dimensions of the metasurfaces elements. Besides a few non-standard technologies (that do not mostly allow arbitrary shapes and dimensions to be obtained), only focused electron-beam lithography (EBL) provides the resolution and the design degrees of freedom required to manufacture suitable metasurfaces. EBL, however, is a sequential process, which is normally not compatible with mass-fabrication, despite some efforts that aim at parallelizing the number of electron-beams to expose a large area on the sample at once. Hence, EBL fabrication costs are high, putting both physical and economical barriers to using EBL-written structures for real-world applications.

SUMMARY

One embodiment of the present invention includes a method of processing a layer structure with a semiconductor layer to form metasurface structures. The method relies on a layer structure that comprises a substrate, a layer stack, and resist structures. The latter comprise a resist material that includes a semiconductor element. The layer stack is arranged on top of the substrate. The resist structures form a pattern on the layer stack. The layer stack comprises: a semiconductor layer (arranged on top of the substrate); a protective layer (arranged on top of the semiconductor layer); and a transfer layer (arranged on top of the protective layer). The protective layer preferably comprises $Al_xO_y$, while the transfer layer may for instance comprise $SiO_2$. The layer structure may for example be obtained by forming the layer stack on top of the substrate, wherein the protective layer is deposited using a process such as atomic-layer deposition, chemical vapor deposition, sputtering, etc.

Exposed portions of the transfer layer are removed by selectively etching the transfer layer. The exposed portions are unmasked portions, i.e., portions that are not masked by the resist structures. After removing the exposed portions, residual portions of the transfer layer remain between the protective layer and the resist structures. Note, a selective etching process is an etching process which is selective with respect to the material to be removed (the transfer layer in the above case).

Next, the resist structures are entirely removed by another selective etching process. This results in exposing transfer layer structures, which are formed by the residual portions of the transfer layer. The transfer layer structures are then transferred into the protective layer by selectively etching the latter, using a further selective etching process. This way, combined portions of residual layer portions are obtained, which comprise, each, a residual portion of the protective layer and a residual portion of the transfer layer.

After that, the semiconductor layer is selectively etched to obtain residual semiconductor structures. E.g., the semiconductor layer is selectively etched using an inductively coupled plasma process, preferably based on $BCl_3$. At this point, the residual semiconductor structures are still masked by the combined portions of residual layer portions as previously obtained. Therefore, the combined portions are finally removed, entirely, by selectively etching the combined portions. This results in exposing the semiconductor structures. This way, metasurface structures are obtained, which are arranged according to the pattern as initially formed by the resist structures on the initial layer stack.

The present approach relies on an indirect transfer process, which results in unprecedently accurate and clean metasurface structures. This is made possible thanks to successive, selective etching steps in a multi-step, multi-layer approach, which notably allows the resist structures to be removed, while keeping the semiconductor layer protected, even though the resist material comprises a semiconductor element. Still, the proposed approach is compatible with both Nanoimprint Lithography (NIL) and EBL methods. Thus, the resist structures may initially be obtained using a NIL process or an EBL process. The mold used to obtain the initial resist structures may thus be used multiple times, making the present methods compatible with mass fabrication and operational at much lower costs than sequential EBL-patterning. The present methods may for example be performed so as to obtain a flat-optical element, metasurfaces of which are formed by the semiconductor structures.

In some embodiments, said resist structures are obtained from a resist layer that initially extends over the layer stack, using a NIL and an EBL technique. In some other embodiments of the present invention, the resist layer is a photo-curable resist; said resist structures are obtained by applying a mold onto the photo-curable resist and curing the photo-curable resist thanks to radiation emitted through the mold. In that case, the mold is light-permissive (e.g., transparent). In variants, the resist layer is a thermally curable resist; the resist structures can be obtained by applying the mold onto the thermally curable resist and curing the thermally curable resist thanks to application of heat. In that case, the mold does not need to be light-permissive. The mold may for example be made from Polydimethylsiloxane (PDMS) or fused silica in either case. In some embodiments, this mold is obtained by molding it from a master obtained using EBL. As said, the mold may advantageously be reused to process one or more other layer structures, similar (or, in fact, identical) to the above layer structure.

Some embodiments of the present invention remove a residual portion of the initial resist layer prior to removing the exposed portions of the transfer layer.

In some embodiments, the transfer layer is selectively etched using a dry etchant. The transfer layer may for instance comprise $SiO_2$, while the dry etchant may comprise $CHF_3$.

In some embodiments where the protective layer comprises $Al_xO_y$ and the transfer layer comprises $SiO_2$, the transfer layer structures are transferred into the protective layer using an etchant that comprises or consists of $BCl_3$.

In some embodiments, the resist structures are entirely removed using a selective etchant. The resist material of the resist structures may for instance comprise silicon, in which case the selective etchant used may advantageously be HBr. The resist may possibly include another semiconductor element, such as germanium, or a combination of such semiconductor elements.

In some embodiments, the method further comprises functionalizing one or more of the exposed semiconductor structures by depositing one or more materials thereon. For example, the metasurface structures may be coated with molecular receptors to selectively bind analytes.

In some embodiments, the exposed semiconductor structures (as obtained after entirely removing the combined portions of residual layer portions) each have a lateral dimension that is between 1 nm and 500 nm, on average. The lateral dimension is measured parallel to a main surface of the substrate. In some embodiments, this lateral dimension is larger than 50 nm and a standard deviation of said lateral dimension is less than 5 nm. Additionally, in some embodiments, the exposed semiconductor structures (as obtained after entirely removing the combined portions of residual layer portions) each have a vertical dimension that is between 10 nm and 500 nm, on average. The vertical dimension is measured perpendicular to the main surface of the substrate. In some embodiments, this vertical dimension is larger than 100 nm and a standard deviation of said vertical dimension is less than 5 nm.

Fabrication methods embodying the present invention will now be described, by way of non-limiting examples, and in reference to the accompanying figures.

BRIEF DESCRIPTION OF SEVERAL VIEWS OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which:

FIGS. 1A-1C are cross-sectional views illustrating high-level processing steps of a layer structure to form semiconductor metasurface structures, according to a prior art method. The process captured in FIGS. 1A-1C is not according to the present invention. This process illustrates how a NIL process is used to fabricate semiconductor metasurface structures that replicate small EBL-written structures;

Figure 2A:
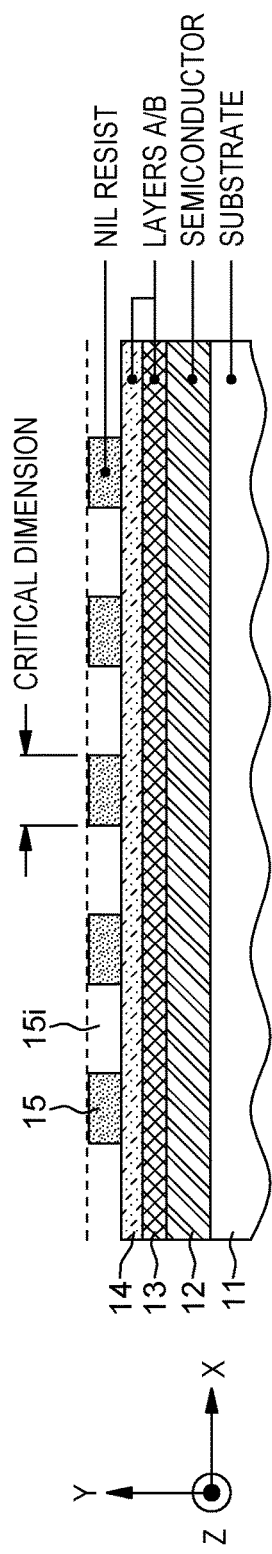
FIGS. 2A-2F are cross-sectional views illustrating high-level processing steps of a layer structure with a semiconductor layer to form metasurface structures, according to embodiments of the present invention.
Figure 2B:
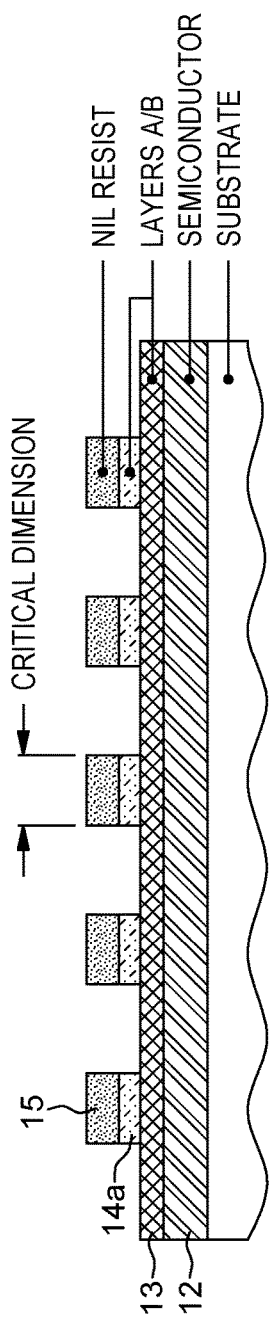

The accompanying figures show simplified representations of devices or parts thereof, as involved in certain embodiments of the present invention. Technical features depicted in the figures are not necessarily drawn to scale. Similar or functionally similar elements in the figures have been allocated the same numeral references, unless otherwise indicated.

DETAILED DESCRIPTION OF EMBODIMENTS OF THE INVENTION

The method (as depicted in FIGS. 1A, 1B and 1C) aims at replicating small EBL-written structures using a NIL technique. The direct transfer of the resist structures into the semiconductor layer gives rise to lateral feature size reduction due to the non-selective etching of the semiconductor layer in respect to the NIL resist. Removing the residual resist layer gives rise to surface roughening (essentially in the vertical direction), for the same reasons.

In contrast with the steps of FIGS. 1A-1C, the indirect transfer process shown in FIGS. 2A-2F results in accurate dimensions of the final semiconductor metasurface structures, as well as clean and defect-free surfaces, thanks to the multilayer structure used and the selective etching steps introduced One possible way to upscale sub-wafer-scale EBL structures to full wafer scales is to use a NIL technique with pick-and-place or step-and-repeat processes. This way, a master stamp (EBL-fabricated) can be cast-molded and replicated on a target substrate by multiple process steps using—at the end of the process—a NIL resist for pattern transfer, (for example, as an etch mask). However, many high-performance NIL resists, in particular the photo-curable ones, include a semiconductor element (such as silicon) and are therefore not compatible with a direct structuring of the semiconductor metasurfaces, as the required selectivity in etching and finally removing the resist on top the semiconductor metasurfaces is lacking.

The replication of nanometer-scale EBL-written structures is mostly achieved using photo-NIL. This approach can thus be used to fabricate semiconductor metasurface structures. In this approach, a photo-curable, liquid resist is cured through a light-transparent mold that can be made from PDMS or fused silica. As a result, a NIL resist structure is present on the target substrate (see FIG. 1A), together with a residual NIL resist layer that can be easily removed because it is typically very thin (2-10 nm). The NIL resist can then be transferred into the target semiconductor substrate as follows:

First, a non-selective removal of the NIL resist is performed, as indicated above. This leads to a small reduction in the NIL resist structure;

Second, deep reactive ion etching (DRIE) is used to selectively etch the unprotected semiconductor structure area, while keeping the masked area essentially unaffected (see FIG. 1B). The anisotropy of the DRIE process again leads to a small reduction in the lateral (in-plane) dimensions of the structures, with respect to the critical dimensions of the NIL mask; and Third, the NIL resist (such as NIL resist 15a in FIG. 1B) is non-selectively removed (for example, using $SF_6$ oxygen plasma). This reduces again the lateral dimensions and also the vertical dimensions of the unprotected semiconductor structure, mostly in a non-uniform way (see FIG. 1C).

While some uniform reductions may potentially be compensated by design with labor-intensive efforts and a limited process-tunability in case dimensions are modified, the non-uniform reduction, however, is very difficult to handle. This particular issue, as well as severe implementation limitations of the above process, led the inventors to design and develop novel methods of fabrication of semiconductor metasurface structures, which rely on a multistep pattern transfer and the introduction of high-selective etching steps. Such methods may notably combine EBL and NIL, as in preferred embodiments. They allow metasurface structures to be fabricated with unprecedented accuracy (typically 1-nanometer-accurate dimensions) and clean surfaces to be achieved, thanks to the selective etching and cleaning at the end of the processing The following description is structured as follows. First, general embodiments and high-level variants are described (Section 1). The next section addresses more specific embodiments and technical implementation details (Section 2). Note, the present method and its variants are collectively referred to as "the present methods". All references Sij refer to methods steps of the flowchart of FIG. 4, while numeral references pertain to physical parts or components of the processed structures (FIGS. 1-3).

I. General Embodiments and High-Level Variants

Figure 4:
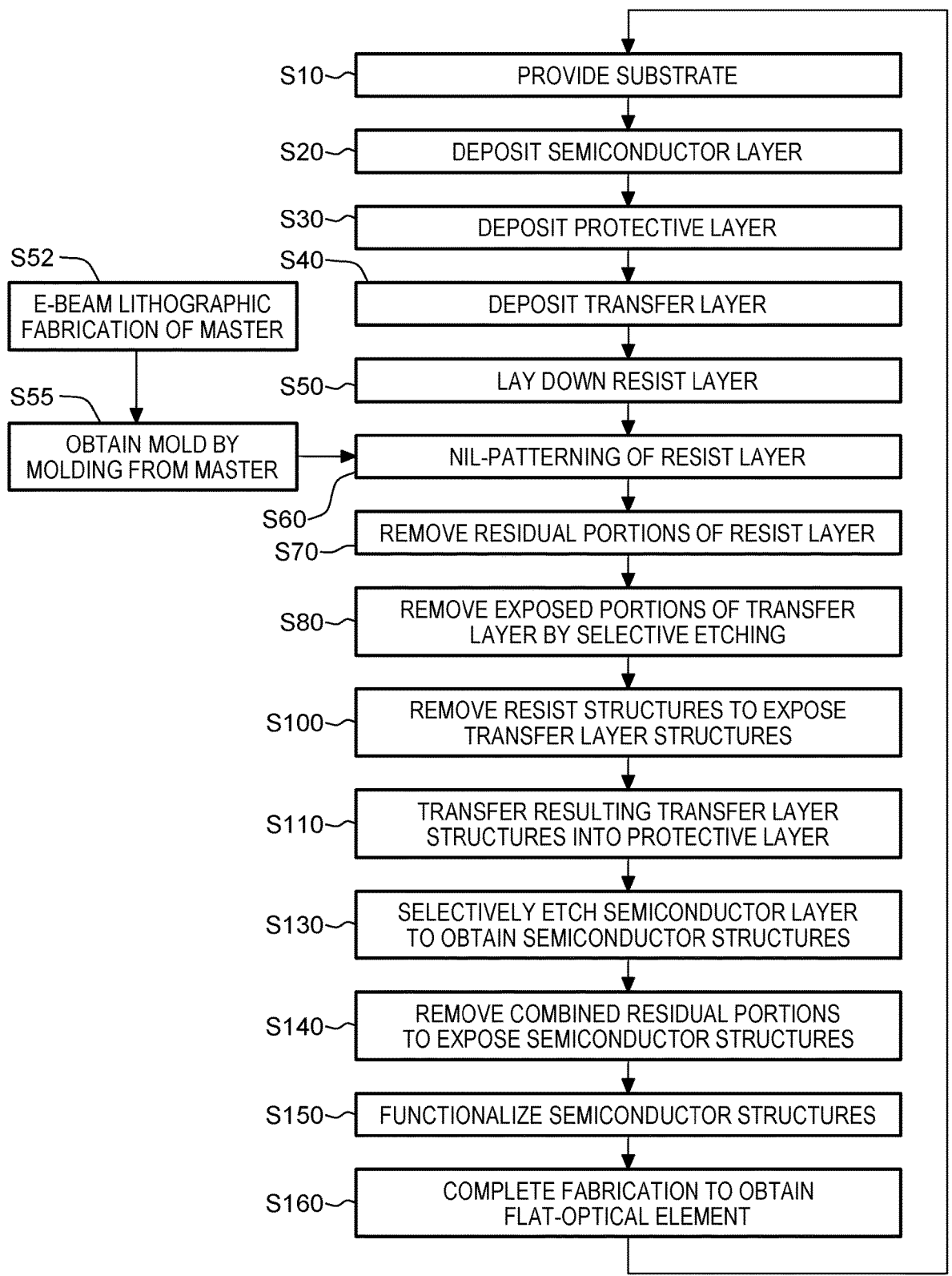
FIG. 4 is a flowchart illustrating high-level steps of a fabrication method of such a flat-optical element, according to embodiments of the present invention.

In reference to FIGS. 2 and 4, an aspect of the present invention is first described, which concerns a method of processing a layer structure with a semiconductor layer to form metasurface structures. The method can notably be used to fabricate a flat-optical element.

First, a layer structure 11-15 is provided S10-S60. The layer structure 11-15 comprises a substrate 11, a layer stack 12-14, and resist structures 15, see FIG. 2A. Note, the present methods may possibly comprise preliminary steps to fabricate or complete the layer structure 11-15, as discussed later in reference to certain embodiments. The layer structures can be at least partly pre-fabricated in some embodiments of the present invention.

The layer stack 12-14 is arranged on top of the substrate 11. In general, the substrate 11 can be a metal, a semiconductor, or an insulator (e.g., glass or polymer). In some embodiments, the substrate 11 comprises glass, quartz, fused silica or other transparent materials, so as to be sufficiently light-permissive, as needed in applications discussed in section two, below. The layer stack 12-14 comprises a semiconductor layer 12, which is arranged on top of the substrate 11, as well as a protective layer 13 (e.g., $Al_xO_y$), arranged on top of the semiconductor layer 12, and a transfer layer 14 (e.g., $SiO_2$), which extends on top of the protective layer. Note, the transfer layer 14 includes portions that are masked by the resist structures 15, as well as exposed portions (that is, portions that are not masked by the resist structures 15, see FIG. 2A).

The resist structures 15 are made of a resist material that comprises a semiconductor element, such as silicon, germanium, etc. They form a pattern on the layer stack 12-14 (that is, they form a two-dimensional arrangement of structures 15). This arrangement is normally periodic and consists of a repeating arrangement of one or more structures 15 (typically two structures). The aim is to eventually achieve a similar pattern for the semiconductor metasurface structures. Suitable patterns of metasurface structures are known in some instances.

Second, the exposed portions of the transfer layer 14 are removed S80 by selectively etching S80 the transfer layer 14. In some embodiments of the present invention, the transfer layer 14 is selectively etched S80 using a dry etchant. This dry etchant can be used to open unmasked sections of the transfer layer 14, leaving the target semiconductor layer unaffected, thanks to the protective layer 13. For example, the dry etchant, in some embodiments, includes $CHF_3$ where the transfer layer 14 includes $SiO_2$. As a result, residual portions 14a of the transfer layer 14 are sandwiched between the protective layer 13 and the resist structures 15 (see FIG. 2B). The etching performed at step S80 leaves the semiconductor layer 12 and the protective layer 13 essentially unaffected, as the result of the selective etching process used. The material compositions can be adequately chosen to that aim.

Figure 2C:
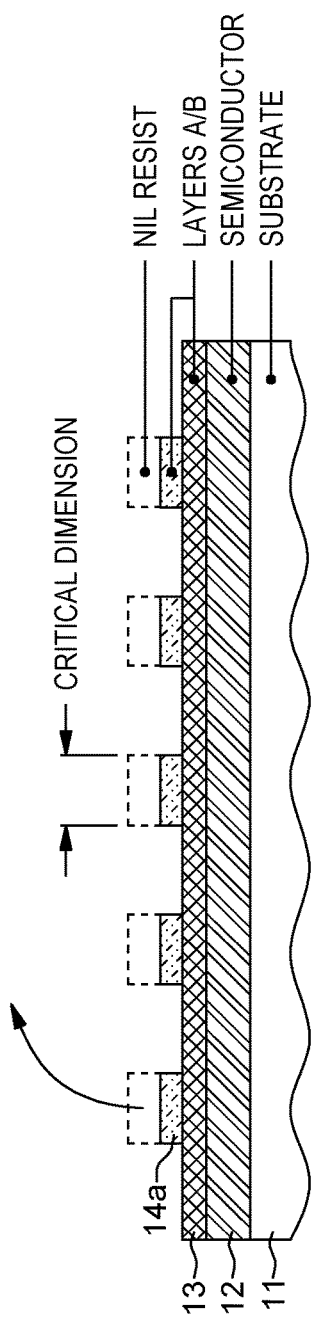
Figure 3:
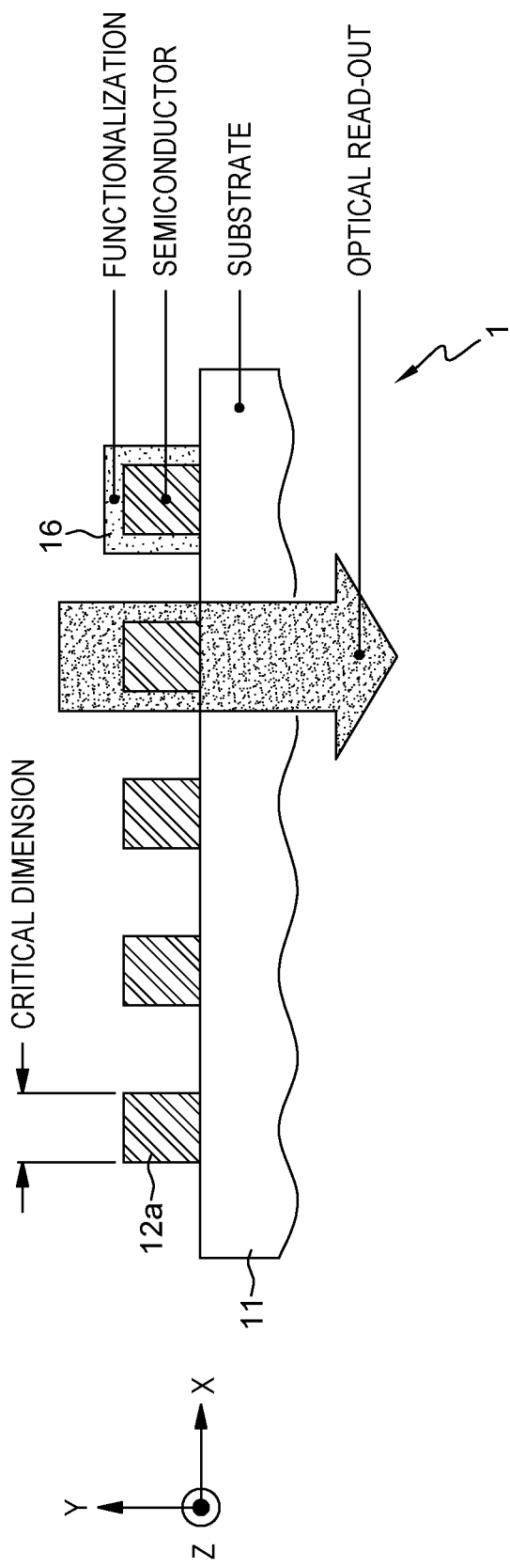
FIG. 3 is a two-dimensional (2D) cross-sectional view of a flat-optical element with semiconductor metasurfaces, including functionalized metasurfaces, as obtained with a fabrication method according to embodiments of the present invention. The arrow represents an optical read-out being performed in transmission.

Next, the resist structures 15 are entirely removed S100, as seen in FIG. 2C. This is achieved by selectively etching the resist structures 15, using a selective etchant. This step causes transfer layer structures 14a to be exposed. The structures 14a are formed by the residual portions 14a of the transfer layer as obtained after step S80. The selective etching step S100 leaves the transfer layer 14 and protective layer 13 essentially unaffected. For example, if the resist material of the resist structures 15 comprises silicon, then the selective etchant may comprise HBr.

The intermediate selective etching of the resist structure 15 eventually allows clean and defect-free structures to be obtained. In contrast, when the resist structures are non-selectively removed (for example, using an $SF_6$ oxygen plasma), this results in simultaneously reducing the lateral and vertical dimensions of the unprotected semiconductor structure in a non-uniform way (see FIG. 1C).

Figure 2D:
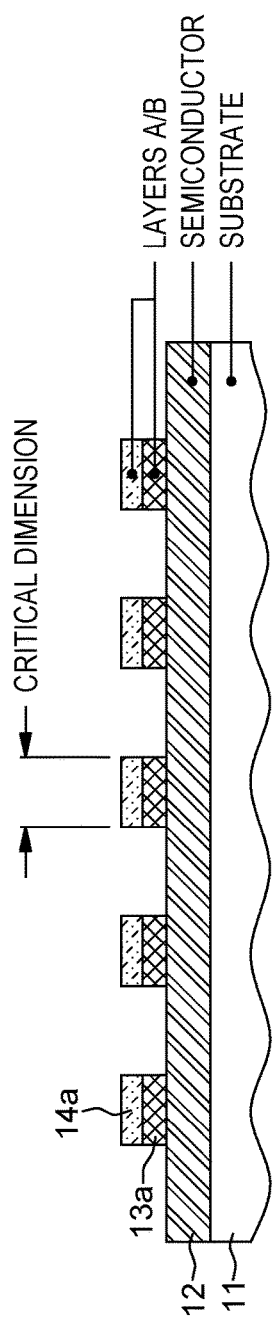

The transfer layer structures 14a are subsequently transferred by an anisotropic and therefore directed process S110 into the protective layer 13 by selectively etching layer 13. This way, combined portions 13a, 14a of residual layer portions are obtained (see FIG. 2D). The combined portions 13a, 14a comprise residual portions 13a of the protective layer and residual portions 14a of the transfer layer. That is, each combined portion 13a, 14a includes a residual portion 13a and a residual portion 14a, as seen in FIG. 2D. For example, where the protective layer 13 comprises $Al_xO_y$ and the transfer layer 14 comprises $SiO_2$, then the transfer layer structures 14a can be transferred S110 into the protective layer 13 using an etchant that includes $BCl_3$. Other etchants can be contemplated for other material classes. The thin protective layer 13 allows a very conformal patterning at the top surface of the semiconductor layer 12, which is key for obtaining clean metasurfaces 12a.

Figure 2E:
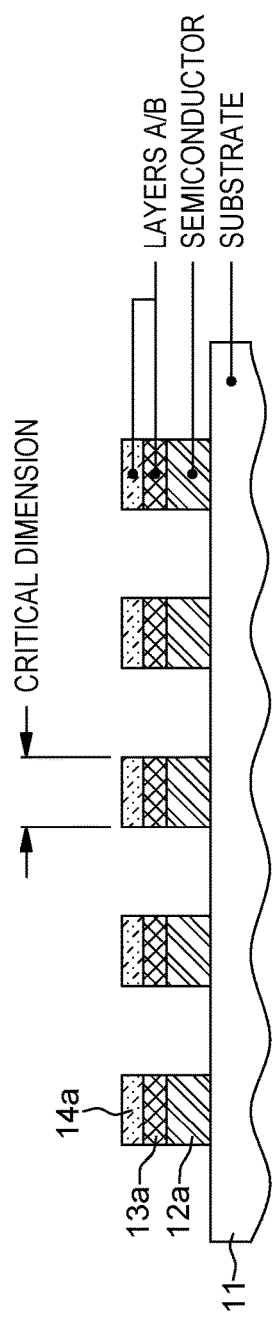

The semiconductor layer 12 is then selectively etched S130, which leads to residual semiconductor structures 12a. The structures 12a are residual portions of the initial semiconductor layer 12, which are masked by the combined portions 13a, 14a, as seen in FIG. 2E. For example, the semiconductor layer 12 may be selectively etched S130 using an inductively coupled plasma process (ICP). One may for instance selectively pattern the semiconductor structure masked by the combined and opened protective/transfer layers using a $BCl_3$-based ICP process. Such a process is preferred to a reactive ion etching (RIE) process as it is more anisotropic and therefore directed. However, a RIE process may possibly be used in variants, in particular for very thin semiconductor layer 12 or for a desired tapering in vertical direction.

Figure 2F:
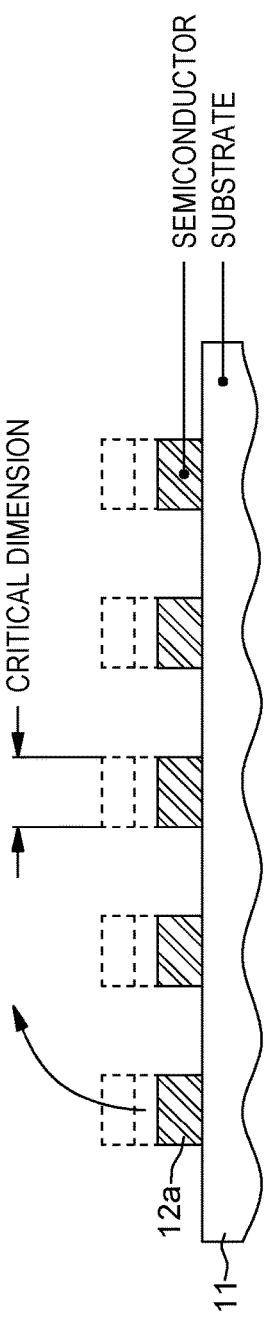

Finally, the combined portions 13a, 14a are entirely removed S140. This is achieved by selectively etching the combined portions 13a, 14a, which causes the semiconductor structures 12a to be exposed, as seen in FIG. 2F. Thanks to the previous step S80 and S100, the selective etching of the combined portions 13a, 14a does essentially not affect the desired geometry of the final semiconductor structures 12a.

This way, metasurface structures are obtained, which are arranged according to the initial pattern formed by the resist structures 15. Note, such metasurfaces are structured, in-plane, according to a subwavelength-scaled pattern. This pattern is formed in the plane (x, z) in the accompanying drawings.

For achieving good optical properties, the metasurface's cross-sectional shape perpendicular to the substrate may have to be untappered, which requires a directed etching.

It is important to note that resists that are free of semiconductor elements can mostly be removed in a sufficiently selective process. In the present context, however, the resist structures are assumed to contain a semiconductor element (for example, silicon and/or germanium). This is a challenge where semiconductor metasurface structures must be obtained, because a resist comprising a semiconductor is a priori not compatible with a selective structuring of semiconductor-based metasurfaces using known fabrication processes.

Accordingly, traditional methods do not permit the required selectivity for removing such type of resists in combination with patterning of semiconductors. Rather, some methods typically rely on a direct transfer of NIL-fabricated resist structures into the layer of interest (see FIGS. 1A-1C). Such process steps, when applied to the fabrication of small semiconductor metasurface structures, necessarily result in reducing the size of the structures and in roughening their surfaces, owing to the non-selective removal of the NIL resist structures. Indeed, the non-selective removal of the NIL resist structures affects the semiconductor layers, due to the similar material compositions (mostly silicon-based ingredients).

In contrast, the indirect transfer processes proposed herein result in unprecedently accurate and clean features. This is made possible thanks to material contrasts introduced by the transfer and protective layers, which can be exploited for the successive, selective etching steps involved in the proposed multi-step, multilayer approach. In particular, the intermediate removal (e.g., selective etching of the resist structures 15) allows clean and defect-free feature surfaces to be obtained as the resist structures 15 are removed beforehand, while keeping the semiconductor layer 12 protected. Importantly, the proposed approach is compatible with both combined EBL-NIL and EBL only methods. I.e., the resist structures 15 may have previously been obtained using a NIL process or an EBL process.

All this is now described in detail, in reference to particular embodiments of the invention. To start with, the present methods may include initial fabrication steps to obtain or complete the layer structure 11-15. The semiconductor layer, the protective layer, and the transfer layer may for instance be deposited using known deposition technique, so as to form S20-S40 the layer stack 12-14 on top of the substrate 11. The protective layer 13 is deposited S30 using an atomic-layer deposition process. For example, the protective layer 13 may comprise $Al_xO_y$. Next, the resist structures 15 may for example be obtained S60 from an initial resist layer 15i (see FIG. 2A), (that is, a layer that is initially deposited over the layer stack 12-14). Step S60 may advantageously be performed by using a NIL process or an EBL process, as evoked above. Indeed, the same issues as with NIL resists arise for Si-based EBL resists, such as HSQ resists.

For example, the resist layer 15i may be a photo-curable NIL resist. In that case, step S60 may be performed by applying a mold onto the photo-curable resist and then curing the photo-curable resist 15i, thanks to radiation emitted through the light-permissive mold (e.g., PDMS or fused silica). In variants, thermo-curable NIL resists may be used. Note, photo-curable and thermo-curable resists are typically used for NIL techniques, while electron-sensitive materials such as Hydrogen silsesquioxane (HSQ) and derivatives thereof are typically used for EBL techniques.

In both cases, the mold can be obtained by molding an EBL-fabricated master. That is, the mold used at step S60 may first be obtained S55 by molding it from a master obtained S52 using EBL. For example, the mold used to obtain S60 the resist structures 15 may be positive mold from the negative mold (master) obtained by EBL. Thus, NIL resist structures may be present on the target substrate (FIG. 2A), which replicate the accurately written EBL structures. It is important to note that a residual NIL resist layer may persist on the layer stack 12-14 after forming the resist structures 15 (see step S60). This residual layer may, however, easily be removed because it is very thin. The present methods include removing S70 a residual portion of the initial resist layer 14i, prior to removing the exposed portions of the transfer layer 14. This can for example be achieved with a non-selective removal of the residual NIL resist, which may possibly lead to a (very) small thickness reduction in the NIL resist structures 15.

Interestingly, the mold used at step S60 may possibly be reused to process one or more other layer structures, similar to the above layer structure 11-15. In fact, this mold may possibly be reused between 50 and 500 times, this depending on the actual process used, in particular residuals of the NIL resist remaining on the mold after separation that cannot be entirely cleaned. Then another replica may be necessary. In all cases, however, the fabrication costs of the initial master and the subsequent molds are amortized, allowing EBL-written structures to be upscaled.

In some embodiments, the present methods further comprises functionalizing S150 one or more of the exposed semiconductor structures 12a as obtained at the end of step S140. The functionalization is typically achieved by depositing one or more materials 16 on the exposed semiconductor structures 12a. Typically, the deposited materials include molecular compounds or dielectric coatings. The semiconductor structures 12a may for instance be functionalized using molecular coatings (e.g., receptors). These receptors may notably be formed by molecular compounds immobilized on the top surface of the metasurface structures, wherein the molecular receptors comprise, each, several moieties, including a first moiety A anchored to the semiconductor surface 12a, and a second moiety B, which is a molecular receptor chemically connected via a backbone to the first anchoring moiety. Chemically speaking, this backbone can be regarded as another moiety. In some variants, one may also functionalize the structures with antibodies, viruses, or other kind of particles for sensing applications. Not all metasurface structures of the device need necessarily be functionalized, they can also have metasurfaces-intrinsic properties (such as for light manipulation purposes). Finally, in some embodiments of the present invention, the present methods includes completing S160 the fabrication to obtain a flat-optical element.

Referring now to FIG. 3, the present methods are preferably performed so as to fabricate S140 a flat-optical element 1. This device is typically designed so as to allow light to be manipulated below the refraction limit, as noted earlier. The metasurfaces of this element 1 are formed by the semiconductor structures 12a, as obtained at the end of steps S140 or S150.

Again, the accuracy and quality of the surface state of the metasurface structures obtained need be emphasized. For example, the present methods allow semiconductor structures 12a to be obtained, which have, each, a lateral dimension that is between 1 nm and 500 nm, on average. This lateral dimension is measured parallel to the main surface of the substrate 11, i.e., parallel to the plane (x, z) in the accompanying drawings. This lateral dimension will likely be between 20 nm and 400 nm, on average, in practice. However, sub-10 nm structures may be needed in specific applications. In some embodiments, this lateral dimension is larger than 50 nm. Still, the standard deviation of this lateral dimension may be less than 5 nm (for each metasurface structure). For example, a 2-3.5 nm replication accuracy between the master and final device may possibly be achieved in practice for layer objects where the metasurface structures have a 50-150 nm lateral dimensions, as confirmed by AFM and SEM experiments.

The above embodiments have been succinctly described in reference to the accompanying drawings and may accommodate a number of variants. Several combinations of the above features may be contemplated. Examples are given in the next section.

II. Specific Embodiments—Technical Implementation Details

This section discloses a multi-step pattern transfer used to fabricate semiconductor metasurface structures that are almost nanometer-accurate 1:1 replica of a master stamp created by EBL. The process allows selective removal of Si-based NIL resist structures while keeping the semiconductor metasurfaces unaffected as they are protected by a protective layer. This way, resonant conditions can deterministically be achieved, by design, and not empirically by process tuning. Moreover, these semiconductor metasurfaces can be functionalized. The process is mass-fabrication compatible and allows upscaling of EBL-written master to very large-area wafers.

The fabrication process proposed is generic for a large variety of patterning tasks in fabricating semiconductor metasurfaces that can be operated as flat optical elements.

The general process to fabricate structures by NIL is known per se. Similarly, the EBL process to create a master stamp is also well-known to persons skilled in the art. A novel processing route for fabricating semiconductor-based metasurfaces is as follows. Reference is again made to FIGS. 2A-2F, as well as to the flowchart of FIG. 4.

- First, atomic-layer deposition is used to deposit S30 a protective layer 13 ($Al_xO_y$) on top the of target semiconductor layer 12 (FIG. 2A). The latter 12 extends S20 on top of a substrate S10. The semiconductor layer may for instance be deposited on top of a quartz substrate, using CVD or sputtering;
- Second, a transfer layer 14 ($SiO_2$) is deposited S40 on top of the protective layer 13 (FIG. 2A), using any suitable deposition technique;
- The triple layer structure consisting of target semiconductor layer 12, the protective layer 13, and the transfer layer 14 is then patterned using NIL, in a traditional way. That is, a NIL resist is deposited S50 and then patterned S60;
- Next, the residual NIL resin is non-selectively removed S70, which at most leads to a small vertical reduction and hardly measurable lateral reduction of the NIL resist structures 15 (FIG. 2A);
- A dry etchant is subsequently used to open S80 the exposed (unmasked) sections of the $SiO_2$ layer 14 (using $CHF_3$), leaving the target semiconductor layer 12 unaffected thanks to the protective layer 13 (see FIG. 2B);
- The NIL resist structures 15 are then entirely removed S100 by an etchant. The latter comprises HBr, it being reminded that the resist comprises silicon (see FIG. 2C);
- Next, the opened transfer layer structures are transferred S110 into the protective layer 13 (using $BCl_3$) (see FIG. 2D);
- The semiconductor structures 12a (as masked by the combined, opened protective and transfer layer portions 13a, 14a) are then selectively patterned S130, using $BCl_3$ in an ICP process (see FIG. 2E); and
- Finally, the protective and transfer layers are entirely removed S140 using BHF; and an additional cleaning step may be done to thoroughly clean the semiconductor metasurfaces.

Some or all of the semiconductor metasurface structures may subsequently be functionalized S150. For example, the metasurface structures may form one or more arrays, and one or more of these arrays may include metasurface structures coated with molecular receptors for selectively binding analytes. As a result, such arrays may possibly result in distinct outcomes when performing an optical characterization experiment, (for example, in transmission) as depicted in FIG. 3.

The process described above requires the following components:
- A substrate 11 with appropriate optical properties (such as transparent and/or reflective properties) to support the metasurface structures, as well as their fabrication and operation. For example, a light-permissive substrate can be placed directly (and mostly lens-free) in front of the light source, the read-out device or the optical building block in general.
- A semiconductor layer 12, which eventually leads to plasmonically or dielectrically active metasurface structures 12a. Such structures 12a are optionally functionalized (by molecular coatings and/or receptors); and
- A protective layer 13, a transfer layer 14, and a (structured) NIL layer 15, which are all eventually removed.

Semiconductor materials (in particularly highly doped ones) are attractive plasmonic and dielectric materials for optical metasurfaces. While plasmonic effects are caused by collective charge carrier oscillations of the free charge-carrier in the active material induced by an incident (external) electromagnetic field, dielectric metasurfaces do not necessarily require free charge carriers, owing to the variety of the underlying effects, including Mie and Fabry-Perot resonators.

Surface plasmon polaritons are widely used in applications (such as plate readers for biosensing and medical analytics) by tracking shifts in the plasmon resonance upon binding analytes by surface-bound receptors. Dielectric metasurfaces are less commonly used so far because the underlying effect requires a much higher level of dimension accuracy to operate properly. However, when nanometer-dimensions are achieved in a reproducible and mass-fabrication compatible process, as enabled by the present fabrication methods, then their optical performances can potentially outperform plasmonic metasurfaces. As an example, the resonances obtained are much narrower (SPR with 150-400 nm FWHM for dielectric metasurfaces with 5-10 nm FWHM) and excellent extinction coefficients (30-

80%) are obtained when operated in transmission (FIG. 3) rather than in backscattering reflection.

Such narrow resonances can be used for multiplexed sensing for IR-based dimensions. While fabricating metasurfaces for the IR regime is still feasible by UV photolithography or EBL, scaling the structures down to operate appropriately in the near-IR or even visible regime is challenging, owing to a linear scaling law for dimensions. Thus, it is desired to be able to fabricate accurate semiconductor metasurface structures for an optical read-out realized with conventional visible or near-IR detectors, in mobile embodiments rather than bulky IR detectors.

Given the large range of possible functionalities that can be realized by dielectric metasurfaces, a multitude of applications can be targeted, which include optical applications in general and sensing-related applications in particular. General optical applications notably include: spectral optical filtering components (such as narrow-band filters); other light-manipulating components (such polarization-changing, light-bending, and/or light-scattering); supercavity dielectrics-based lasers; meta-lenses; beam deflectors; and holograms. Sensing-related applications include: receptor-based biosensors; receptor- and label-free biosensors; environmental monitoring devices; and medical diagnostic devices.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention.

Various combinations of the features described with respect to any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention may not be limited to the particular embodiments disclosed, but that the present invention will include all embodiments falling within the scope of the appended claims. In addition, many other alternative variants and/or embodiments other than those explicitly referenced and/or implied above are considered to be sufficiently descriptive to enable a person having ordinary skill in the art to make and/or use those alternative variants and/or embodiments. More specifically, other materials, processes or applications than those explicitly mentioned may be contemplated by the person having ordinary skill in the art.

Definitions for certain terms will be presented below:

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Including/include/includes: unless otherwise explicitly noted, means "including but not necessarily limited to."

Comprise/comprises/comprising: As used in the specification (specifically outside of the claims section), this term is intended to be perfectly synonymous with the term "include" and its various conjugated forms (as defined herein in this specification). The term "comprise" (and its various conjugated forms) as used in the claims is to be given the ordinary interpretation that is consistent with patent claim interpretation.

What is claimed is:

1. A method comprising:
providing a layer structure, with the layer structure including a substrate, a layer stack, and resist structures made of a resist material, with the resist material including a semiconductor element, wherein the layer stack is arranged on top of the substrate, the resist structures form a pattern on the layer stack, and the layer stack includes a semiconductor layer on top of the substrate;
providing a protective layer on top of the semiconductor layer with a transfer layer on top of the protective layer;
removing exposed portions of the transfer layer that are not masked by the resist structures by selectively etching the transfer layer, whereby residual portions of the transfer layer remain between the protective layer and the resist structures;
removing the resist structures by selectively etching the transfer layer, to expose transfer layer structures formed by said residual portions of the transfer layer;
transferring the transfer layer structures into the protective layer by selectively etching the protective layer, to obtain combined portions that comprise residual portions of the protective layer and residual portions of the transfer layer;
selectively etching the semiconductor layer to obtain residual semiconductor structures, which are masked by the combined portions, with the residual semiconductor structures including a thin protective layer;
removing the combined portions by selectively etching the residual semiconductor structures to expose the thin protective layer and thereby obtain metasurface structures that are arranged according to the pattern on the layer stack, with the pattern on the layer stack forming one or more arrays; and
coating the one or more arrays on the obtained metasurface structures with molecular receptors for selectively binding analytes.

2. The method according to claim 1 wherein:
providing the layer structure includes obtaining said resist structures from a resist layer initially extending over the layer stack, using one of a nano imprint lithography technique and an electron-beam lithography technique.

3. The method according to claim 2 wherein:
said resist layer is a photo-curable resist; and
obtaining said resist structures includes applying a mold onto the photo-curable resist and curing the photo-curable resist due, at least in part, to radiation emitted through the mold.

4. The method according to claim 3, wherein the method further comprises:

prior to applying the mold, obtaining the mold by molding it from a master obtained using electron-beam lithography.

5. The method according to claim 4, wherein the method further comprises:
reusing the mold to process another layer structure similar to said layer structure.

6. The method according to claim 2, wherein the method further comprises:
removing a residual portion of the initial resist layer, prior to removing the exposed portions of the transfer layer.

7. The method according to claim 1, wherein the transfer layer is selectively etched using a dry etchant.

8. The method according to claim 7, wherein the transfer layer includes $SiO_2$ and said dry etchant includes $CHF_3$.

9. The method according to claim 1, wherein
the protective layer includes $Al_xO_y$,
the transfer layer includes $SiO_2$, and
the transfer layer structures are transferred into the protective layer using an etchant including $BCl_3$.

10. The method according to claim 1, wherein the semiconductor layer is selectively etched using an inductively coupled plasma process.

11. The method according to claim 10, wherein the inductively coupled plasma process is based on $BCl_3$.

12. The method according to claim 1, wherein the resist structures are entirely removed using a selective etchant.

13. The method according to claim 12, wherein the resist material of the resist structures includes silicon and the selective etchant includes HBr.

14. The method according to claim 1, wherein providing the layer structure further includes:
forming the layer stack on top of the substrate, wherein forming the layer stack includes depositing the protective layer using an atomic-layer deposition process.

15. The method according to claim 1, wherein the protective layer includes $Al_xO_y$.

16. The method according to claim 1, wherein the transfer layer includes $SiO_2$.

17. The method according to claim 1, wherein the method further comprises:
functionalizing one or more of the exposed semiconductor structures by depositing one or more materials thereon.

18. The method according to claim 1, wherein a flat-optical element is obtained, with the metasurfaces of the flat optical element is formed by the semiconductor structures.

19. The method according to claim 1, wherein the exposed semiconductor structures have, each, a lateral dimension that is between 1 nm and 500 nm, on average, said lateral dimension being measured parallel to a main surface of the substrate.

20. The method according to claim 19, wherein said lateral dimension is larger than 50 nm and a standard deviation of said lateral dimension is less than 5 nm.

* * * * *